United States Patent [19]

Cenker et al.

[11] 4,228,528
[45] Oct. 14, 1980

[54] MEMORY WITH REDUNDANT ROWS AND COLUMNS

[75] Inventors: Ronald P. Cenker, Coplay; Frank J. Procyk, Center Valley, both of Pa.

[73] Assignee: Bell Telephone Laboratories, Incorporated, Murray Hill, N.J.

[21] Appl. No.: 10,739

[22] Filed: Feb. 9, 1979

[51] Int. Cl.² ............................................ G11C 13/00
[52] U.S. Cl. .................................. 365/200; 307/238; 365/210
[58] Field of Search ................ 365/200, 210; 307/238, 307/274

[56] References Cited

U.S. PATENT DOCUMENTS

| 3,735,368 | 5/1973 | Beausoleil | 365/200 |
| 4,051,354 | 9/1977 | Choate | 365/200 |

Primary Examiner—Terrell W. Fears
Attorney, Agent, or Firm—Arthur J. Torsiglieri

[57] ABSTRACT

A memory is provided with standard rows and columns and spare rows and columns for substitution for standard rows and columns found to have defective cells. Each of the decoders associated with a standard row and/or column includes provision for being disconnected if found to be associated with a defective row or column. Each of the decoders associated with a spare row and/or column is designed normally to be deselected for any address but to be able to assume the address of any disconnected row or column. Disconnection of the standard decoders and substitution of the spare decoders are made possible by appropriate inclusion of fusible links which can be selectively opened by laser irradiation.

6 Claims, 3 Drawing Figures

MEMORY WITH REDUNDANT ROWS AND COLUMNS

TECHNICAL FIELD

This invention relates to random access semiconductor memories and is concerned particularly with providing redundancy in the memory to improve yields.

BACKGROUND OF THE INVENTION

As integrated circuit memories become larger and more complex, it becomes extremely difficult to fabricate a memory array which is entirely free of defective bits. If it be required that a memory be entirely defect-free to be acceptable, the yield in manufacture of acceptable large memories tends to be very low.

As a consequence, increasing consideration is being given to including, in a memory, redundant cells which can be substitued for defective cells whereby there may be achieved a memory which has defect-free cells at operative sites.

There has been hitherto a number of schemes proposed which provide for the substitution of defect-free redundant cells for defective cells. Typical are the schemes described in U.S. Pat. Nos. 3,753,235, 3,753,244 and 4,047,163 but these typically have involved the necessity of considerable additional circuitry.

Considerations which we have viewed as important for a defect-tolerant memory are as follows:

1. The entire memory would all be on one chip.
2. The extra cells and circuitry should not interfere with the function of an otherwise good chip, i.e., if a chip is fault-free without utilizing spares, no steps should be required to disable spares.
3. The testing and substitution should be possible by a fast, simple, high-yield process to avoid long turn-around times and/or low repair yield. Advantageously, both the disabling of standard rows and columns having defective cells and the substitution of spare rows and columns should be done by a similar technique, preferably by a process involving making disconnections rather than connections.
4. The incorporation of spares should result in essentially no performance degradation to the basic circuit. Preferably the use or nonuse of spares should change the characteristics little as viewed from the external terminals of the memory.
5. The provision for spares should not significantly increase the total area needed for the chip.

SUMMARY OF THE INVENTION

The invention involves the provision on the chip of a number of spare rows and columns of storage cells in addition to the numbers needed for the basic memory. In addition a special decoder is associated with each spare row and column; and while normally inoperative or deselected, it is designed to be made operative if needed. Moreover the decoder associated with each standard row and column of the basic memory cell is designed to be normally operative, but can be readily disabled if desired. In manufacture, after preparation of the chip, the cells in the standard rows and columns are tested and the location of all faulty cells in the basic memory array is stored in a separate external memory. Then there is permanently disabled the decoder associated with either each row or column including a defective cell in the basic memory. Then one of the special decoders associated with a spare row or column, as appropriate for substitution, is modified to be enabled or selected by the address associated with a decoder of the basic array which has been disabled, so that the spare row or column associated with the selected special decoder will effectively thereafter be substituted in the operative array for the row or column associated with the decoder that has been permanently disabled.

In particular in the preferred embodiment of the invention, the standard decoders are designed to be disabled and the special decoders are designed to be enabled by opening a fusible link in their circuits as by a laser.

DETAILED DESCRIPTION

Figure 1:
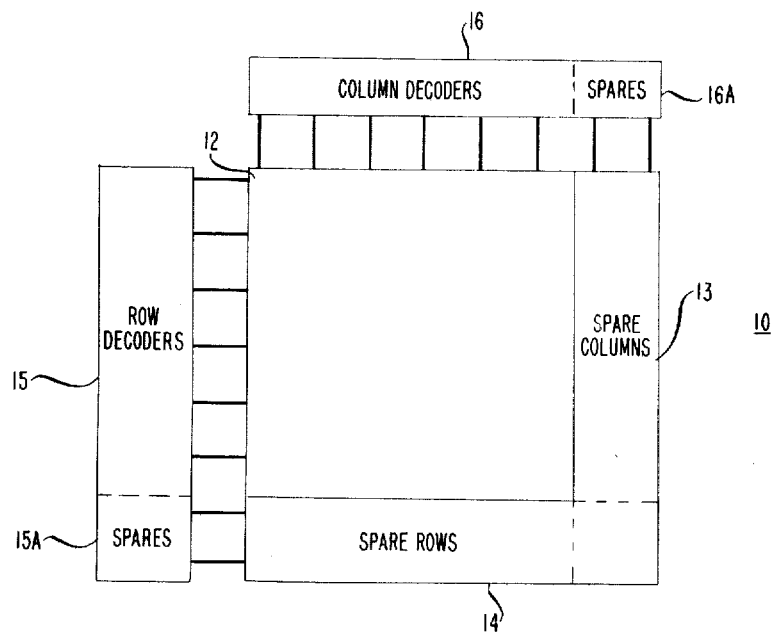
FIG. 1 shows in simplified schematic form the layout of the portions of a memory chip important to the invention.
Figure 2:
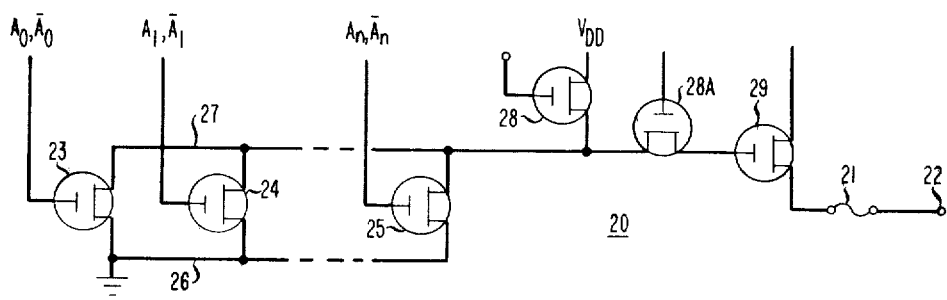
FIG. 2 shows in circuit schematic form an illustrative standard decoder (either row or column) with provision for disabling the decoder in accordance with the invention.
Figure 3:
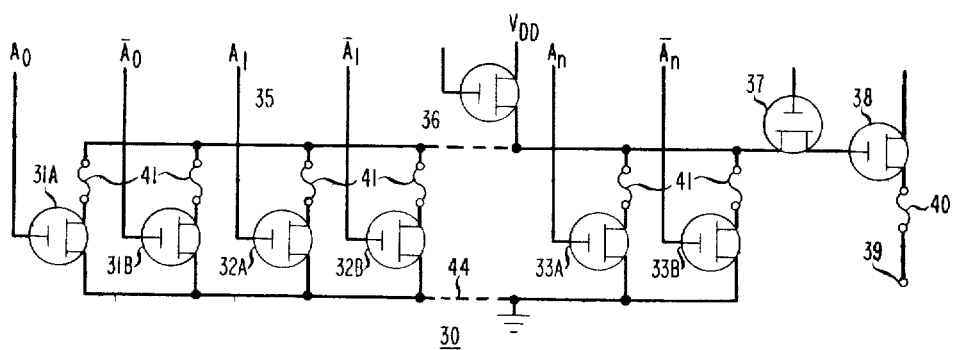
FIG. 3 shows in circuit schematic form an illustrative spare decoder (either row or column) with provision for enabling the decoder in accordance with the invention.

With reference now to the drawing, FIG. 1 shows a memory chip 10 in which a plurality of memory cells are arranged in a two-dimensional array of rows and columns, each cell being accessed by a row conductor, usually termed the word line, and by a column conductor, usually termed the bit line. In familiar fashion a particular cell is accessed for reading or writing by applying a suitable voltage to the unique combination of individual row and column conductors accessing such cell. In accordance with the invention, the array is augmented beyond its standard size 12 by the inclusion of redundant rows and columns 13, 14, each including the like number of redundant cells, each identical to the standard cells. In one 64 K random access memory embodiment four spare rows and four spare columns were found to provide a satisfactory degree of redundancy. Of course, in other embodiments different numbers might provide preferable. For selecting individual rows and columns to which the enabling voltages are to be applied, the memory includes for each standard row its individual row decoder 15 and for each standard column its individual column decoder 16. Additionally each spare row and column has associated with it its own spare decoder 15A, 16A. In FIG. 2, there is shown a suitable decoder for use with either the standard rows or columns. As known in the art, each decoder is selected by an address unique to it made up of a distinctive combination of binary pulses. As a consequence to select a particular one of 128 or $2^7$ rows or columns, a seven digit address is required. In addition the memory includes an individual spare decoder for each of the spare rows and columns of cells. A suitable decoder for use with the spare rows and columns is shown in FIG. 3.

Turning now to FIG. 2, the decoder 20 is of a kind well known in the art except for the provision of the fusible link 21 shown in its output conductor which if opened disconnects the decoder from its output terminal 22 which supplies the associated row or column conductor either directly or by way of coupling transistors (not shown). Basically it comprises a parallel group of MOS address decoding transistors, one for each digit of the address to be decoded. For simplicity, only three transistors 23, 24, 25 are shown, each having its source and drain path connected between conductors 26 and 27. Conductor 26 is maintained at ground while decode node conductor 27 is maintained at a high voltage, essentially $V_{DD}$, when the decoder is in an active state. Activity of conductor 27 is controlled by precharge transistor 28 whose gate voltage is controlled by a decoder precharge pulse which is periodically applied when it is desired to precharge the decoders of this kind. It is wasteful of power to keep the gate of transistor 28 continuously at a high voltage.

It is also advantageous to insert serially along conductor 27 interrupt transistor 28A which serves as a transmission gate permitting isolation of the high capacitance of conductor 27 from the drive transistor 29 before the drive is turned on. The on-off state of transistor 28A is controlled by an appropriate control pulse applied to its gate. As well known to workers in the art, a particular decoder of the kind shown is selected when all of the inputs to the decoding transistors 23, 24, 25, supplied from the addressing circuits, are low, in which case conductor 27 is maintained high and the associated driver transistor 29 whose gate is controlled by the voltage on conductor 27 is kept on, permitting a high drive voltage provided on the drain of transistor 29 to be applied to output terminal 22. If the particular decoder is to be deselected (not selected), one of the inputs applied to it from the addressing circuits will be high, in which case the voltage on conductor 27 will drop and transistor 29 will be turned off whereby no drive voltage reaches terminal 22. As previously mentioned, a fusible line 21 is included in each of the standard decoders and this link is left undisturbed if the particular decoder and its associated cells are to be retained in the standard array, as is the case if the prior testing has determined that the cells to be accessed by way of its associated conductor are all defect-free. However, if the prior testing has established that any cell to be accessed by it is defective and so not fit for use in the memory, the link in the decoder is opened, advantageously by laser vaporation.

In a preferred embodiment, the link opened is a layer of polysilicon doped to be highly conductive, about 4000 Angstroms thick, about 14 microns long, and about 3 microns wide, and it is opened by being vaporized by incident high energy pulses provided by a 1.06 micron YAG laser. Advantageously, this is done after the memory chip fabrication is essentially complete by which time the polysilicon conductor will have been covered with a phosphorous doped glass which, however, is transparent to the radiation.

In FIG. 3, there is shown a spare decoder 30 of the kind that advantageously is used between the address circuits and the individual column and row conductors associated with each spare row and column. This decoder advantageously is of a design that requires nothing to be done if the associated spare row or column is not to be used. However, if it is to be used, its substitution can be effected by making simple disconnections in the same manner as is used to disable rows or columns of the standard array found to have defective cells.

Consistent with the requirements indicated previously, these decoders should make it feasible to substitute conveniently one of the spare rows or columns for any one of the normal rows or columns found defective. It is convenient to use as the spare column or row decoder one which can be tailored to have any standard column or row address, respectively. To this end, each spare decoder comprises a plurality of transistor pairs, 31A, 31B, 32A, 32B, and 33A, 33B, one of each pair for the address and the other its complement, and the number of address decoding transistor pairs matches the number of bits in the decoded address as with a standard decoder. For the sake of simplicity, again only three pairs are shown. Each transistor is connected between the conductor 34, maintained at ground, and the conductor 35 which serves as the decode node. Conductor 35 is activated as desired by applying an enabling pulse to the gate of the precharge transistor 36 which results in the periodic application of $V_{DD}$ to conductor 35. As with the standard decoders, in the interest of saving power, an operating voltage is not maintained continuously on the gate of transistor 36. Additionally, as with the standard decoder, interrupt transistor 37 serves as a transmission gate to isolate the drive transistor 38 from the high capacitance of conductor 35. Drive transistor 38, when gated on by a high voltage on conductor 35 by way of the transmission gate 37, permits a high voltage supplied to its drain to be applied to the terminal 39 which supplies the corresponding spare row or column conductor. Provision is made by the inclusion of a fusible link 40 of the kind used in the standard decoders in the output lead to disconnect the decoder if later it is desired not to include this spare row or column in the active memory, for example, if it is found that a cell in this spare row or column is defective.

Selective activation of a spare decoder is provided by inclusion of a separate fusible link 41 advantageously in the drain path of each of decoding transistors 31A, 31B, 32A, 32B, and 33A, 33B, of the kind used in the output of the standard decoders. Prior to laser fusion of any of the links, each spare decoder is deselected during every reading or writing operation because both an address and its complement appear on the address decoding transistor gates as indicated, insuring that the potential of conductor 35 stays near that of conductor 34. When the need for a spare row or column has been determined and it is decided to activate a specific spare row or column, the address of a faulty column or row is given to the decoder associated with the selected row or column by fusing open the appropriate links. In particular, one of the two links in each transistor pair will be opened so that thereafter each decoder will be selected by a unique combination of binary digits applied to the decoding transistors remaining connected between conductors 34 and 35. When the decoder has been properly coded, it will function indistinguishably from a standard decoder and will be selected when the input pulses are all low, thereby maintaining the voltage on the conductor 35 high whereby the drive transistor 38 is enabled permitting a high voltage to be established on terminal 39 corresponding to the associated row or column conductor.

It is to be understood that various modifications may be made in the basic decoders described consistent with the spirit of the invention. In particular, other techniques may be employed for enabling or disabling the decoding transistors. Also, the decoding transistors may take some other suitable form, such as bipolar transistors. Additionally, the decoders shown have been described for use both as the row and the column decoders. In some instances, it may be desirable to employ different forms of decoders for the rows and for the columns particularly if the address length is different for the two. In some instances, as known in the art, it may be desirable to do the selecting in two steps, using a first group of decoders for part of the address and a second group for the second part of the address, as is done for column selection in the memory described in the commonly assigned copending application filed contemporaneously by us jointly with D. G. Clemons and W. R. Huber, Ser. No. 10,740.

For claim purposes, it will make for simplicity to use the terms "vertical lines" and "horizontal lines" for "columns" and "rows," respectively, and the term "lines" as generic to rows and columns.

We claim:

1. A semiconductor memory (10) comprising a semiconductor chip in which memory cells are arranged in vertical and horizontal lines each with its own decoder and in which some of the lines form the standard memory array (12) and some of the lines (13, 14) are initially spares to be substituted for lines which include defective cells characterized in that each of the decoders (20) associated with the standard lines includes means (21) for disconnecting the associated line from the standard memory array and in which each of the decoders (30) associated with the spare lines includes means (41) for providing any such decoder with the address of a decoder associated with a disconnected line, thereby effectively substituting its associated line in the standard array.

2. A memory in accordance with claim 1 in which the decoders (30) associated with the spare lines is designed to be normally deselected for any address.

3. A memory in accordance with claim 2 in which the means included in the decoders (20) associated with the standard lines is a fusible link (21) which when opened disconnects the decoder and its associated line from the standard array and in which the means included in the decoders (30) associated with the spare lines are a plurality of pairs of fusible links (41) and a decoder is given a desired address by opening a combination of such links.

4. A memory in accordance with claim 3 in which each decoder asssociated with a spare line includes a plurality of pairs of decoding transistors (31A, 31B, 32A, 32B, 33A, 33B) each of which includes a fusible link (41) in its circuit.

5. A process for making a semiconductive memory which includes initially providing on a single chip a plurality of storage cells arranged in vertical and horizontal lines each with its own decoder, some of which form the standard array and some of which form spares and later involves substituting for lines having defective storage cells in the standard array spare lines free of defective storage cells characterized in that each spare line is provided with its spare decoder which normally keeps such line effectively deselected, after testing the lines of the standard array to ascertain the address of defective cells, the decoders associated with the lines including any such defective cells are disabled to disconnect its line from the standard array, and the address of any such disconnected decoder is given to a spare decoder whereby the line associated with such decoder becomes effectively selected as part of the standard array.

6. The process of claim 5 which further includes the steps of opening a fusible link in a decoder associated with the standard array for disconnecting the line associated with such decoder and opening selected fusible links in the spare decoder to give it the address of a disabled decoder and to connect its associated line in the standard array.

* * * * *

UNITED STATES PATENT AND TRADEMARK OFFICE
CERTIFICATE OF CORRECTION

PATENT NO. : 4,228,528

DATED : October 14, 1980

INVENTOR(S) : Ronald P. Cenker and Frank J. Procyk

It is certified that error appears in the above—identified patent and that said Letters Patent is hereby corrected as shown below:

Column 2, line 47, delete "provide" and insert --prove--.

Signed and Sealed this

Third Day of March 1981

[SEAL]

*Attest:*

RENE D. TEGTMEYER

*Attesting Officer*     *Acting Commissioner of Patents and Trademarks*

REEXAMINATION CERTIFICATE (110th)

United States Patent [19]

Cenker et al.

[11] B1 4,228,528

[45] Certificate Issued Jul. 26, 1983

[54] MEMORY WITH REDUNDANT ROWS AND COLUMNS

[75] Inventors: Ronald P. Cenker, Coplay; Frank J. Procyk, Center Valley, both of Pa.

[73] Assignee: Bell Telephone Laboratories, Incorporated, Murray Hill, N.J.

Reexamination Request
No. 90/000,153, Feb. 3, 1982

Reexamination Certificate for:
Patent No.: 4,228,528
Issued: Oct. 14, 1980
Appl. No.: 10,739
Filed: Feb. 9, 1979

Certificate of Correction Issued Mar. 3, 1981.

[51] Int. Cl.$^3$ .............................. G11C 13/00
[52] U.S. Cl. .................. 365/200; 307/441; 365/210
[58] Field of Search ..................... 365/94, 96, 103, 104, 365/114, 210, 200; 307/441

[56] References Cited

U.S. PATENT DOCUMENTS

| | | | |
|---|---|---|---|
| 3,584,183 | 6/1971 | Chiaretta et al. | 219/121 |
| 3,721,838 | 3/1973 | Brickman et al. | 307/303 |
| 3,740,523 | 6/1973 | Cohen et al. | 219/121 |
| 3,753,235 | 8/1973 | Daughton et al. | 365/200 |
| 3,753,244 | 8/1973 | Sumilas et al. | 364/200 |
| 4,047,163 | 9/1977 | Choate et al. | 365/96 |
| 4,130,889 | 12/1978 | Chua | 365/96 |
| 4,228,528 | 10/1980 | Cenker et al. | 365/210 |

OTHER PUBLICATIONS

*IBM Technical Disclosure Bulletin*, vol. 15, No. 2, Jul. 1972, pp. 551 and 552, "Selective Metallization Removal for Redundancy".

*IBM Technical Disclosure Bulletin*, vol. 13, No. 7, Dec. 1970, pp. 1924–1926, "Redundant Memory Cell and Decoder".

*Primary Examiner*—T. W. Fears

[57] ABSTRACT

A memory is provided with standard rows and columns and spare rows and columns for substitution for standard rows and columns found to have defective cells. Each of the decoders associated with a standard row and/or column includes provision for being disconnected if found to be associated with a defective row or column. Each of the decoders associated with a spare row and/or column is designed normally to be deselected for any address but to be able to assume the address of any disconnected row or column. Disconnection of the standard decoders and substitution of the spare decoders are made possible by appropriate inclusion of fusible links which can be selectively opened by laser irradiation.

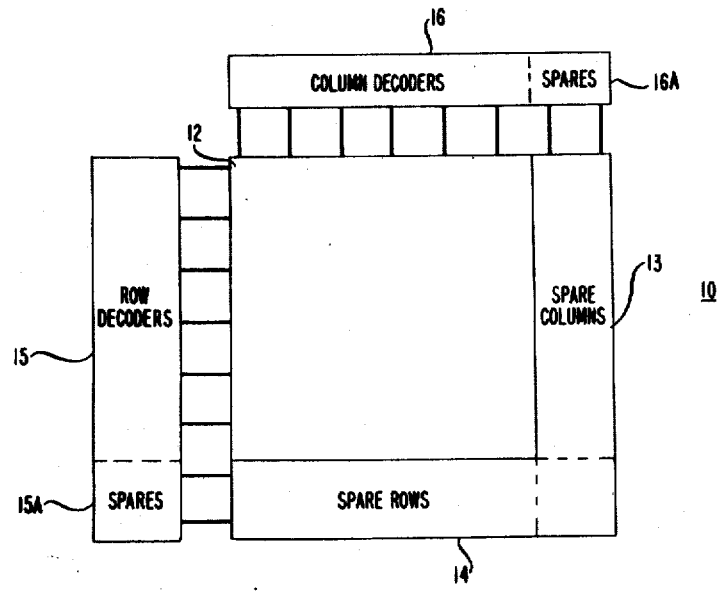

REEXAMINATION CERTIFICATE ISSUED UNDER 35 U.S.C. 307.

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1-6, having been finally determined to be unpatentable, are cancelled.

New claims 7-10 are added and determined to be patentable.

*7. A semiconductor memory comprising a semiconductor chip in which the memory cells are arranged in row and column lines, each with its own decoder, and in which some of the lines form the standard memory array and in which some of the lines are initially spares to be available for substitution for lines of the standard array which include defective cells CHARACTERIZED IN THAT each of the decoders associated with a standard line comprises a parallel group of address decoding transistors, one for each digit of the address to be decoded, a drive transistor whose gate is supplied by said parallel group and whose output is connected to the associated standard line conductor, and a fusible link between the output of the drive transistor and the associated line conductor, and in which the decoder associated with each spare line comprises a plurality of decoding transistor pairs for the true and the complement of each digit of the address to be decoded, each decoding transistor being connnected between a point of reference potential and the decode node, a drive transistor whose gate is connected to the decode node, an associated spare line conductor, and a plurality of fusible links, a separate one between each decoding transistor and the decode node.*

*8. A semiconductor memory in accordance with claim 7 in which each fusible link consists essentially of a layer of doped polysilicon adapted to be opened by being vaporized by incident high energy laser pulses.*

*9. A semiconductor memory in accordance with claim 8 in which each fusible link is covered with a phosphorous-doped glass transparent to the laser pulses.*

*10. A semiconductor memory comprising a semiconductor chip in which memory cells are arranged in vertical and horizontal lines each with its own decoder and in which some of the lines form the standard memory array and some of the lines are initially spares to be substituted for lines which include defective cells and in which each of the decoders associated with the standard lines includes means for disconnecting the associated line from the standard memory array and in which each of the decoders associated with the spare lines includes means for providing any such decoder with the address of a decoder associated with a disconnected line, thereby effectively substituting its associated line in the standard array, characterized in that said means for disconnecting and said means for providing include doped polysilicon fusible links adapted to be opened by incident high energy laser pulses.*

* * * * *

REEXAMINATION CERTIFICATE (1804th)
United States Patent [19]
Cenker et al.

[11] B1 4,228,528
[45] Certificate Issued  Oct. 6, 1992

[54] MEMORY WITH REDUNDANT ROWS AND COLUMNS

[75] Inventors: Ronald P. Cenker, Coplay; Frank J. Procyk, Center Valley, both of Pa.

[73] Assignee: Bell Telephone Laboratories, Incorporated, Murray Hill, N.J.

Reexamination Request:
No. 90/002,446, Sep. 26, 1991

Reexamination Certificate for:
Patent No.: 4,228,528
Issued: Oct. 14, 1980
Appl. No.: 10,739
Filed: Feb. 9, 1979

Reexamination Certificate B0 4,228,528 issued Jul. 21, 1983.

[51] Int. Cl.$^5$ .............................................. G11C 13/00
[52] U.S. Cl. .................................. 365/200; 307/441; 365/210
[58] Field of Search .............................. 365/200, 210

[56] References Cited
U.S. PATENT DOCUMENTS 3,778,886 12/1973 Shields et al.
3,792,319 2/1974 Tsang.
4,250,570 2/1981 Yoshimura.

FOREIGN PATENT DOCUMENTS 47-19     1/1972  Japan.
50-97286  8/1975  Japan.
51-128235 7/1976  Japan.
53-10228  1/1978  Japan.
53-84634  7/1978  Japan.
53-116788 10/1978 Japan.
51-77043  7/1979  Japan.

*Primary Examiner*—Terrell W. Fears

[57] ABSTRACT

A memory is provided with standard rows and columns and spare rows and columns for substitution for standard rows and columns found to have defective cells. Each of the decoders associated with a standard row and/or column includes provision for being disconnected if found to be associated with a defective row or column. Each of the decoders associated with a spare row and/or column is designed normally to be deselected for any address but to be able to assume the address of any disconnected row or column. Disconnection of the standard decoders and substitution of the spare decoders are made possible by appropriate inclusion of fusible links which can be selectively opened by laser irradiation.

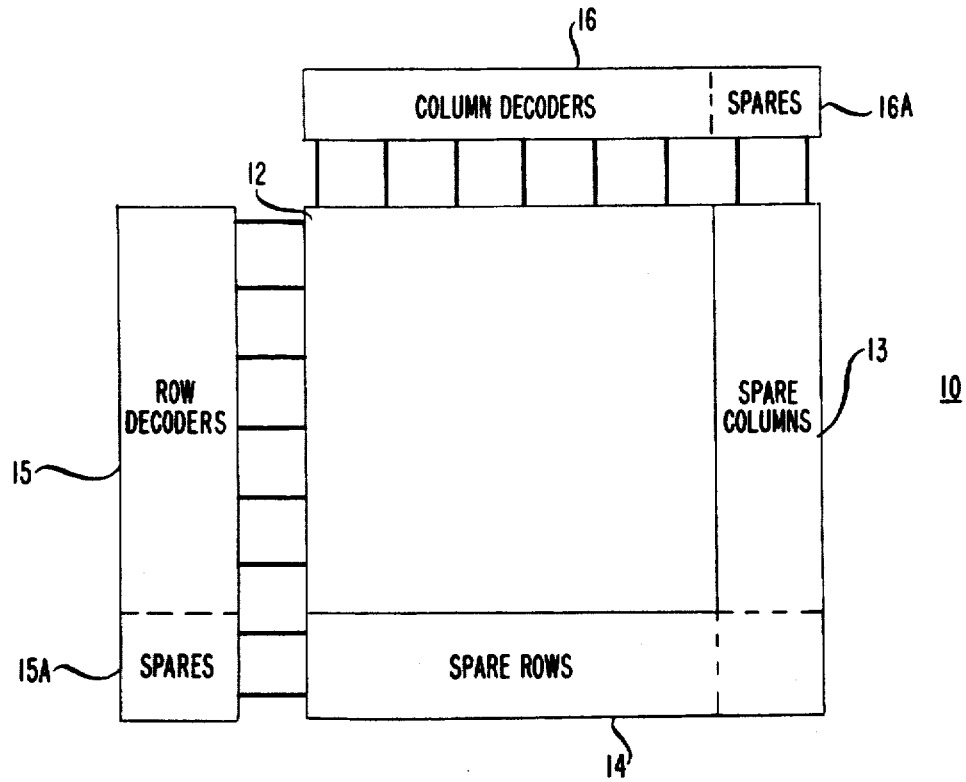

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 7-10 is confirmed.

Claims 1-6 were previously cancelled.

New claim 11 is added and determined to be patentable.

*11. A semiconductor memory in accordance with claim 10 in which at least one fusible link is covered with a phosphorus-doped glass transparent to the laser pulses.*

* * * * *